United States Patent
Benvenga et al.

(10) Patent No.: US 7,120,545 B2
(45) Date of Patent: Oct. 10, 2006

(54) METHOD AND APPARATUS FOR DISPLAYING A CURRENT CONFIGURATION OF TEST INSTRUMENTS TO A USER

(75) Inventors: Carl E. Benvenga, Fort Collins, CO (US); William Hobson Wubbena, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/853,959

(22) Filed: May 25, 2004

(65) Prior Publication Data

US 2005/0278129 A1    Dec. 15, 2005

(51) Int. Cl.
*G06F 19/00* (2006.01)

(52) U.S. Cl. .............................................. 702/68; 703/2
(58) Field of Classification Search ................. 702/68, 702/117–118, 182–185; 703/2
See application file for complete search history.

(56) References Cited

U.S. PATENT DOCUMENTS

2003/0036871 A1* 2/2003 Fuller et al. ............... 702/119
2003/0101025 A1* 5/2003 Shah et al. ................. 702/188

* cited by examiner

*Primary Examiner*—Edward Raymond (57) ABSTRACT

A current configuration of instruments which are connected in a user's test system is determined. The current configuration of instruments is then displayed within a graphical user interface (GUI) by 1) displaying icons representing the instruments, and 2) graphically connecting the icons.

14 Claims, 8 Drawing Sheets

METHOD AND APPARATUS FOR DISPLAYING A CURRENT CONFIGURATION OF TEST INSTRUMENTS TO A USER

BACKGROUND OF THE INVENTION

In today's world of test and measurement, test system instruments are often coupled to a computer that may control and/or acquire data from the instruments. At times, a user may want to determine which instruments are connected in their test system (e.g., because the user wants to verify that the instruments are, in fact, connected to the computer; or because the computer is located remotely from the instruments, and a user wants to determine which instruments they have access to). Typically, the instruments connected in a user's test system will be displayed textually (e.g., in a Microsoft® Windows "treeview").

SUMMARY OF THE INVENTION

In one embodiment, a method comprises determining a current configuration of instruments which are connected in a user's test system. The current configuration of instruments is then displayed within a graphical user interface (GUI) by 1) displaying icons representing the instruments, and 2) graphically connecting the icons.

In another embodiment, apparatus comprises computer readable media, and program code that is stored on the computer readable media. The program code comprises code to determine a current configuration of instruments which are connected in a user's test system, code to retrieve an icon associated with each instrument, and code to display the icons within a graphical user interface (GUI), and to graphically connect the icons in accordance with the current configuration of instruments.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
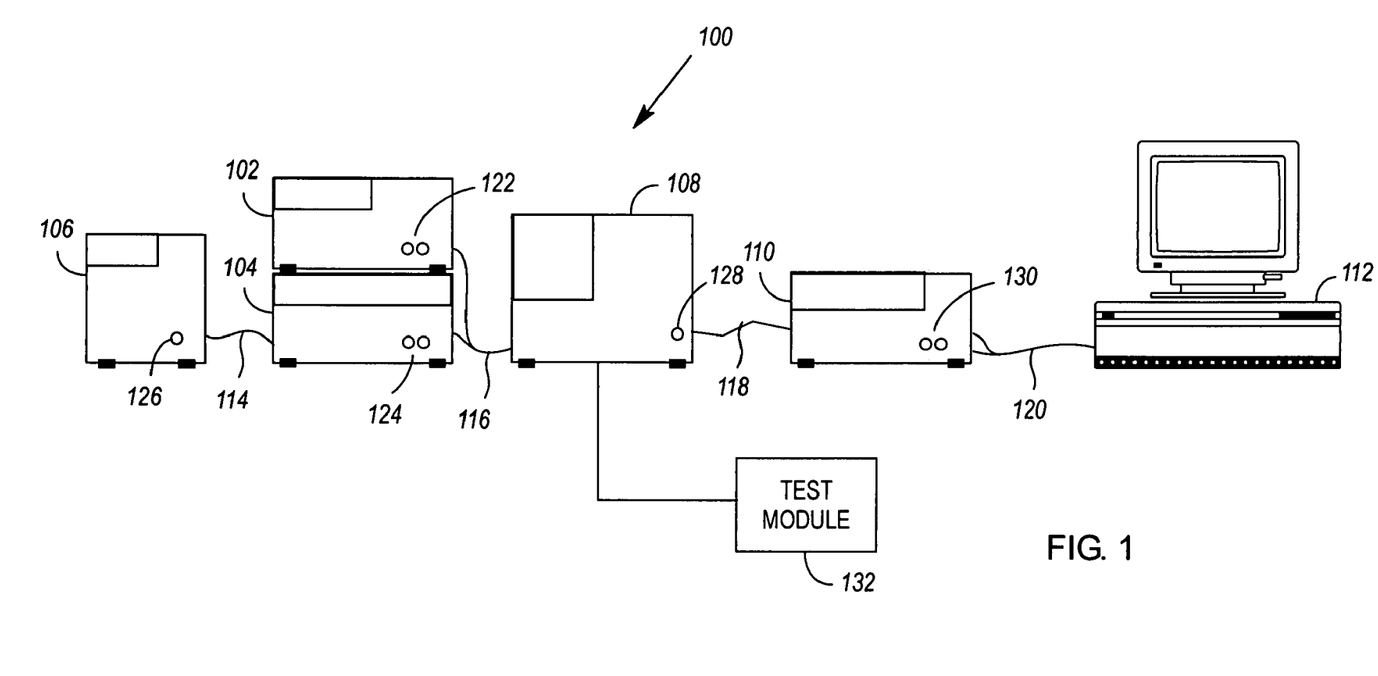
FIG. 1 illustrates a plurality of test system instruments.

FIG. 1 illustrates a plurality of test system instruments 102, 104, 106, 108, 110. By way of example, the test system instruments 102–110 comprise a function generator 102, a multimeter 104, a power supply 106, an oscilloscope 108, and a frequency counter 110. However, the test system instruments could alternately or additionally comprise other instruments.

In general, the various test system instruments 102–110 may take one of two forms: signal source or measurement instrument. Thus, in the collection of instruments shown in FIG. 1, the function generator 102 and power supply 106 would be signal sources; and the multimeter 104, oscilloscope 108 and frequency counter 110 would be measurement instruments.

Some or all of the instruments may have a number of test signal ports 122, 124, 126, 128, 130. For example, the function generator 102 may have pairs of banana plug receptacles 122 at which the function generator 102 may output a programmed waveform. Similarly, the oscilloscope 108 may have one or more BNC connectors 128 through which it may receive monitored waveforms from a device under test (DUT).

Although each of the instruments 102–110 may have various controls (e.g., buttons, dials or sliders) that allow a user to manually configure the instrument, each instrument 102–110 may also have a communication interface such as a GPIB (general purpose instrument bus), USB (universal serial bus) or LAN (local area network) interface. By means of GPIB, USB or LAN cables 114, 116, 118, 120, the instrument's communication interfaces may be coupled to an adjacent or remote computer 112. By means of SCPI (Standard Commands for Programmable Instrumentation) or other protocols, a user of the computer 112 may configure the instruments 102–110, cause signal sources 102, 106 to generate signals, and cause measurement instruments 104, 108, 110 to capture responses from a DUT to which the test signal ports 122–130 of the instruments 102–110 are connected. However, before a user uses the computer 112 to conduct a test using the instruments 102–110, the user will typically want to verify that the instruments 102–110 are connected to the computer 112 and are in working order. In doing this, the user may want the computer 112 to display the current configuration of test system instruments that is connected to the computer 112. If the user then determines that an instrument is missing from the displayed configuration, the user can take various steps to troubleshoot this problem.

Figure 2:
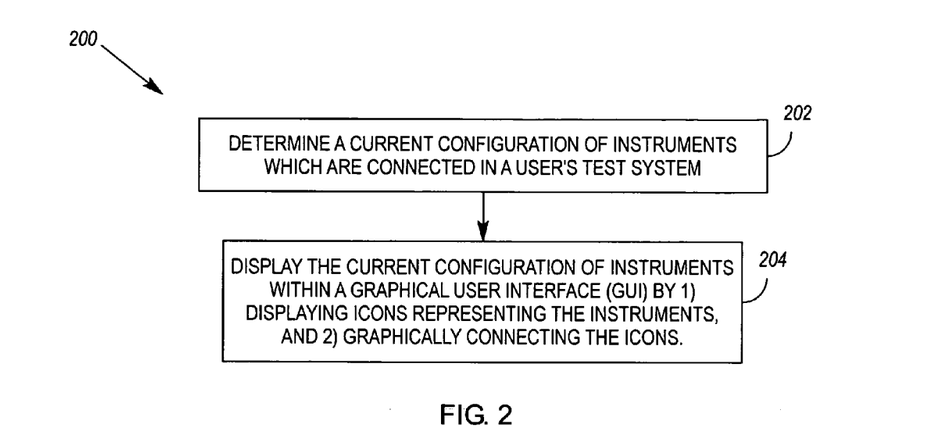
FIG. 2 illustrates an exemplary method for displaying a current configuration of test system instruments to a user.

FIG. 2 illustrates an exemplary method 200 for displaying a current configuration 100 of test system instruments 102–110 to a user. The method 200 comprises determining 202 a current configuration of instruments which are connected in a user's test system, and then displaying 204 the current configuration 100 of instruments 102–110 within a graphical user interface (GUI) by 1) displaying icons representing the instruments, and 2) graphically connecting the icons. In this manner, the user can easily compare the computer's displayed configuration to the instruments 102–110 and connections 114–120 that the user sees in his or her lab.

Figure 3:
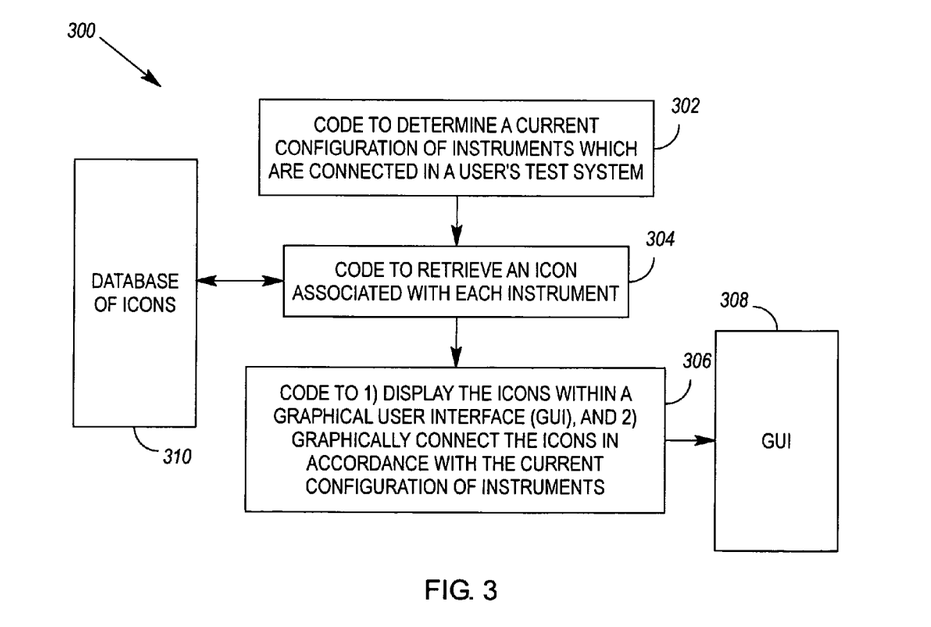
FIGS. 3 & 4 illustrate the display of instruments and their connections within a GUI.
Figure 4:
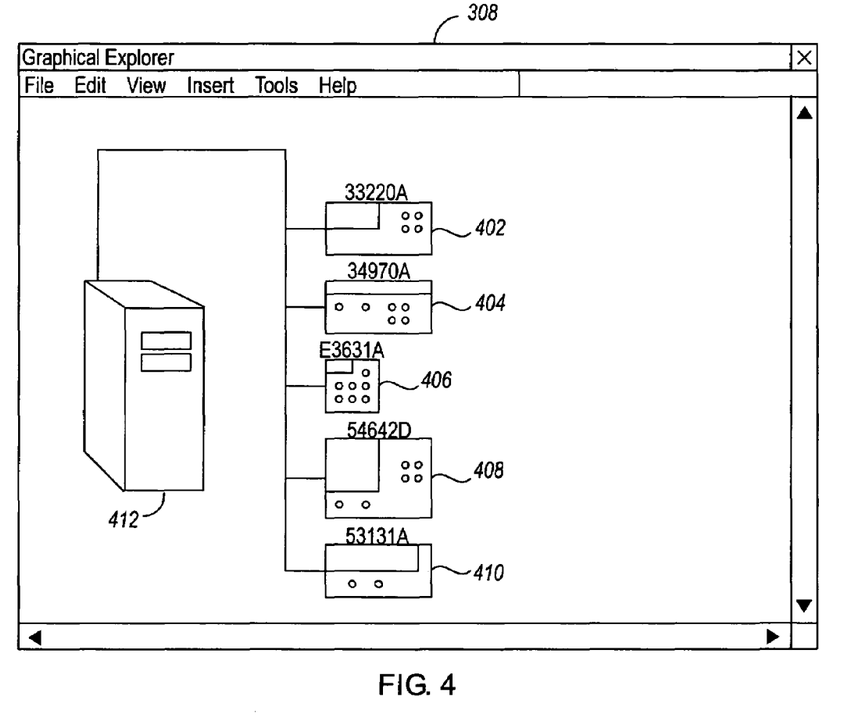

The method 200 may be implemented by program code stored on computer readable media. By way of example, the computer readable media may comprise one or more fixed disks (e.g., hard drives), RAM, ROM, removable media (e.g., optical discs such as CD-ROMs), EPROMs, EEPROMs, magnetic or optical cards, flash memory, or other types of computer readable media. As shown in FIG. 3, the program code 300 may comprise code 302 to determine a current configuration 100 of instruments 102–110 which are connected in a user's test system, code 304 to retrieve an icon associated with each instrument, and code 306 to 1) display the icons 402–410 within a graphical user interface (GUI 308), and 2) graphically connect the icons 402–410 in accordance with the current configuration 100 of instruments 102–110.

The code 302 may determine a current configuration 100 of instruments 102–110 in a variety of ways, such as, for example, querying the instruments 102–110 over a GPIB, USB or LAN using VISA (Virtual Instrument Software Architecture) or SICL (Standard Instrument Control Library) commands. In one embodiment, the code 300 may also determine a dynamic configuration of a switch to which one or more of the instruments 102–110 are connected, and then dynamically display and connect the switch within the GUI 308.

The icons 402–410 are preferably maintained in (and retrieved from) a database 310 of icons. In one embodiment, code is provided to 1) receive identifying data for new instruments, and 2) associate icons representing the new instruments in the database 310.

The icons 402–410 may take various forms, such as pictures or graphical renderings of instruments. Preferably, the icons are sized proportionally to the instruments they represent.

Upon a first search for new instruments, the code 302–306 may determine a current configuration 100 of instruments 102–110, and then display the icons 402–410 of found instruments 102–110, as well as their connections 114–120, within the GUI 308. The code may also display an icon representing the computer 112 on which the GUI 308 is displayed, and may then graphically connect the computer 112 to the current configuration 100 of instruments 102–110.

Upon subsequent searches for new instruments (whether initiated automatically or by a user), the code 302–306 may determine a current configuration 100 of instruments 102–110, compare the current configuration 100 to a past configuration, and then add the icons of newly found instruments to the display within GUI 308. After finding an instrument, the code 302–306 may then search for bus interfaces identified in the address of the instrument and, within the GUI 308, graphically connect the identified interfaces using appropriate bus wires.

Although the code may initially place newly found instruments in default locations, the code 300 preferably implements a host of conventional drawing tools such as drag-and-drop, resize, snap-to-grid, font select, line format (bus line width, color, etc.), and draw. As known in the art, these features may be implemented by allowing a user to position a graphical pointer over an item to which the feature is to be applied, select the item, and then apply the feature.

Figure 5:
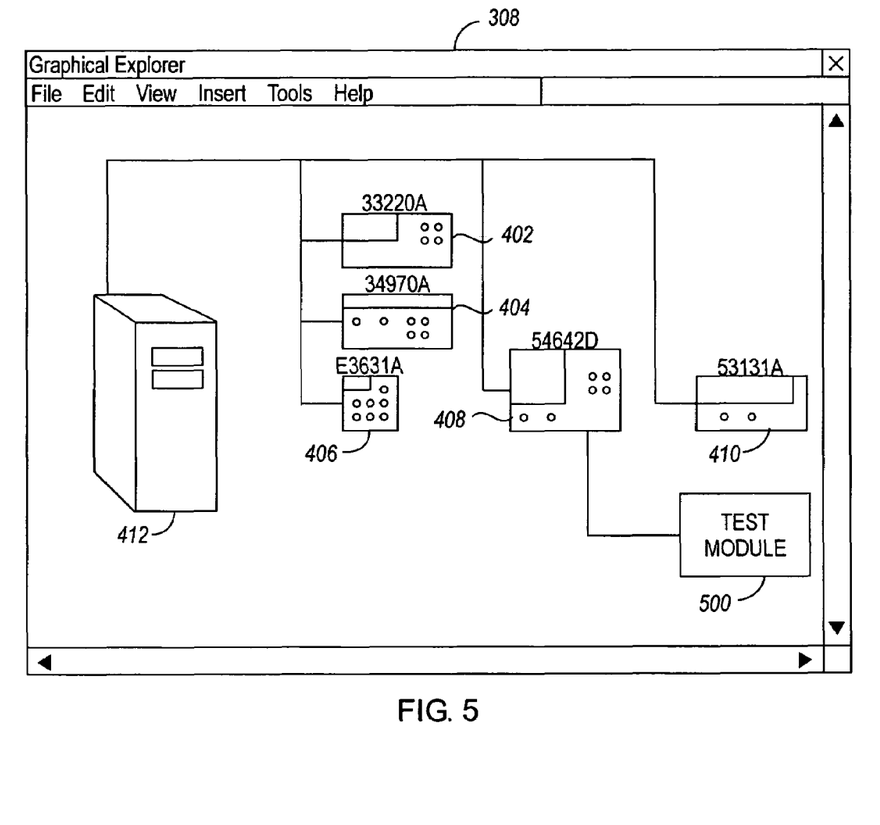
FIGS. 5–9 illustrate various screens of an instrument properties interface.

A user may want to draw, for example, to add a test module 500, device under test, or other non-discoverable device or wire to the items displayed within GUI 308. A user may want to drag-and-drop the icons 402–410 to arrange them in accordance with how they have arranged their instruments in their lab (e.g., the user may want to stack icons in the GUI 308 so that they correspond to stacked instruments in their lab; see FIG. 5). In response to a user repositioning an icon, the code 300 may automatically reroute the graphical connections between the icons (e.g., to ensure that icons do not overlap buses that they are not connected to).

In one embodiment, the code 300 allows a user to "hide" instrument icons. For example, a user could be allowed to right-click on a selected instrument icon and then select a "hide" menu feature. Preferably, even when an instrument icon is hidden, information pertaining to the icon's instrument is still stored with the current configuration information.

In another embodiment, the code 300 compares the current configuration to a past configuration and, upon detecting differences in the configurations, graphically represents the differences within the GUI 308. By way of example, differences may be represented by different colors, and/or by different box styles that surround or shade an icon. For example, a first color and box style (e.g., a green outline of a rectangle) could be used to highlight and identify icons associated with instruments that appear in the current but not the past configuration. A second color and box style (e.g., a red outline of a rectangle having a slash through) could be used to highlight and identify icons associated with instruments that appear in the past but not the current configuration. In addition, a third color and box style (e.g., a dashed yellow outline of a rectangle) could be used to highlight and identify icons associated with instruments that are believed to appear in the past and current configurations, but which have one or more properties that do not match. If the code 300 provides the afore-mentioned means to graphically represent the differences between two instrument configurations, the GUI 308 may be provided with a menu or other option to turn the comparison indicators ON or OFF.

The code 300 may enable a user to trigger a manual instrument configuration "update", or may automatically execute on a periodic basis to thereby "automatically update" the icons and connections displayed in the GUI 308.

Figure 6:
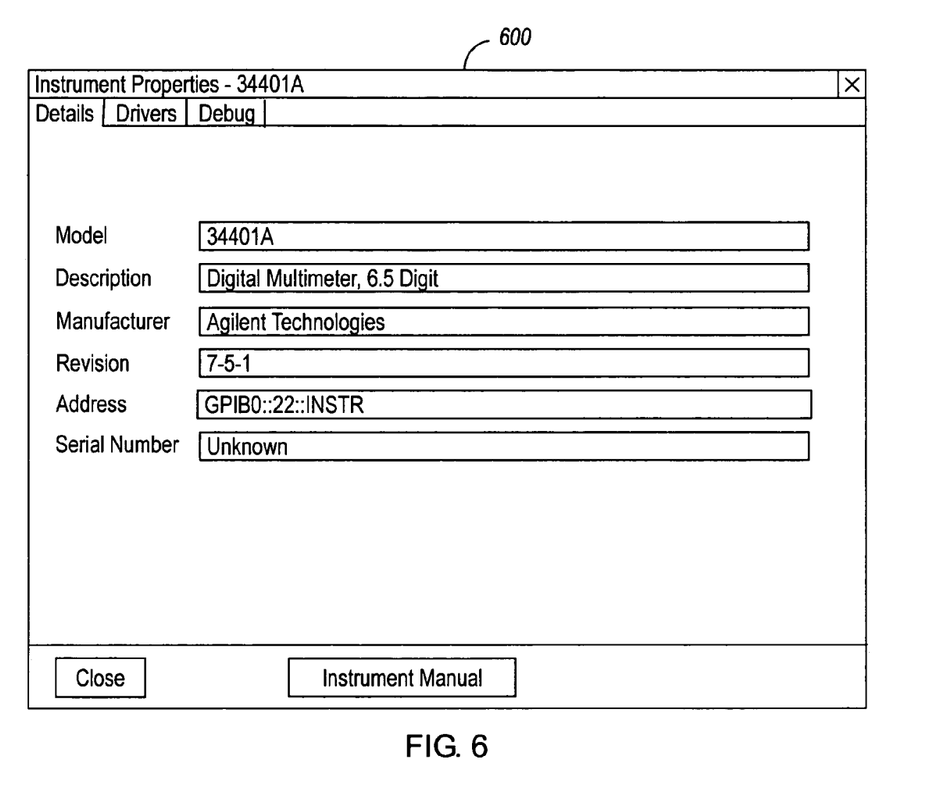

By, for example, right-clicking on a selected instrument icon and then clicking on a pop-up menu selection, a user may choose to launch an Instrument Properties interface. FIG. 6 shows a Details page 600 of the Instrument Properties interface. The Details page 600 may provide basic information about the instrument represented by the selected icon. The information may comprise, for example, the instrument's model number, description, manufacturer, firmware revision, address and serial number. In some cases, some or all of this information may not be available, or may not be returned by the instrument. In one embodiment, some or all of the fields may be editable.

Figure 7:
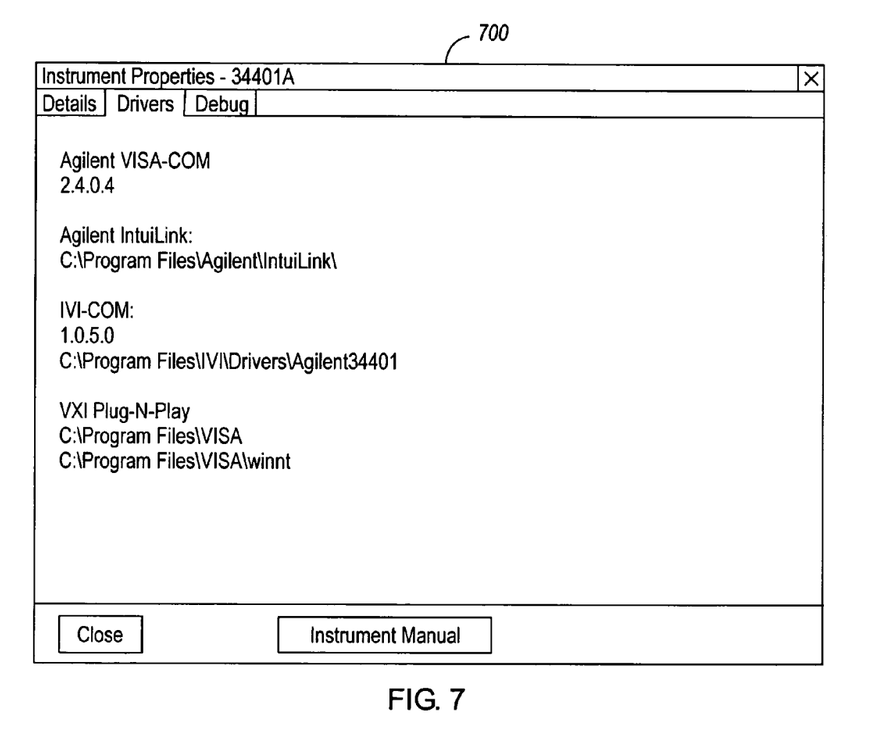

FIG. 7 shows a Drivers page 700 of the Instrument Properties interface. The Drivers page 700 may list all of the drivers that have been found for the instrument (in contrast to just displaying the driver(s) that are currently in use). In one embodiment, the drivers are listed by type, software revision and installation directory (without identifying the driver's file name).

Figure 8:
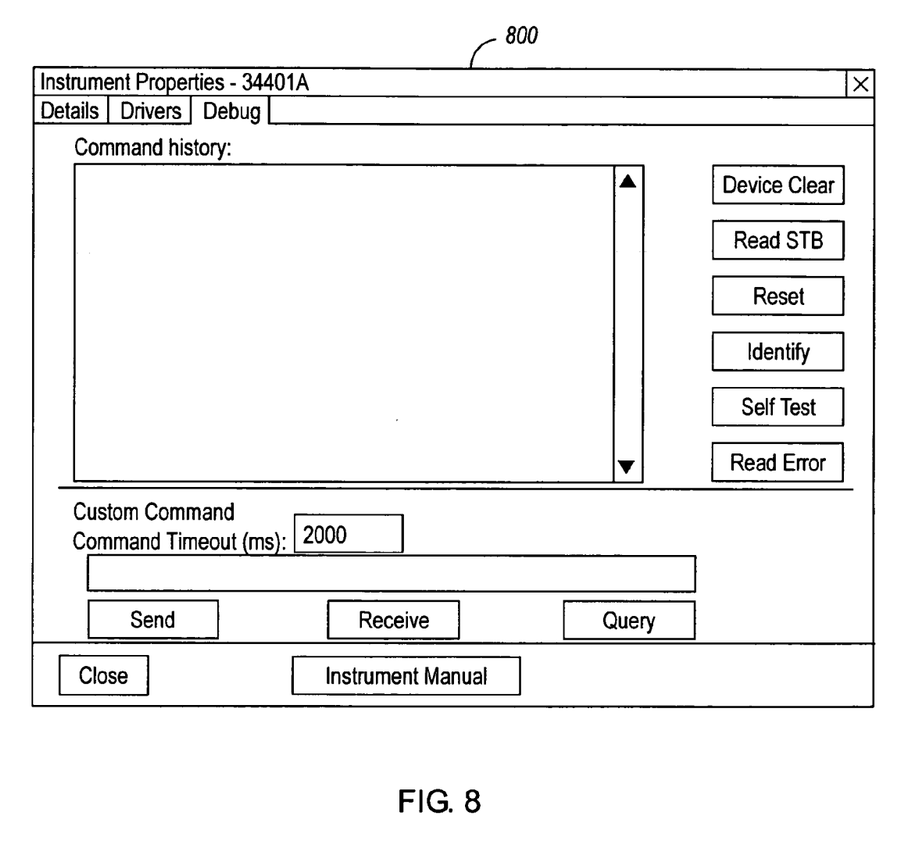

FIG. 8 shows a Debug page 800 of the Instrument Properties interface. The Debug page 800 may provide a user with a command interface for communicating directly with an instrument. In one embodiment, the command interface accepts and receives commands conforming to the SCPI command protocol. Pre-programmed as well as custom commands may be allowed. In FIG. 8, the command interface comprises the pre-programmed commands "Device Clear", "Read STB", "Reset", "Identify", "Self Test" and "Read Error". The functions of these commands are as follows:

Device Clear: sends a clear to an instrument and its drivers;
Read STB: reads a status byte from an instrument;
Reset: sends a hard reset to an instrument;
Identify: requests the Identify string from an instrument;
Self-Test: initiates a self-test of the device; and
Read Error: reads the system error stack from an instrument.

The command interface may further comprise text fields for accepting custom commands, a command timeout value, and buttons to "Send" to, "Receive" from, or "Query" the instrument. "Send" merely sends a command to the instrument, "Receive" merely requests a response from an instrument, and "Query" sends a command to the instrument and then waits for a response for a period of time up to the specified command timeout period. A command history window may also be provided.

Figure 9:
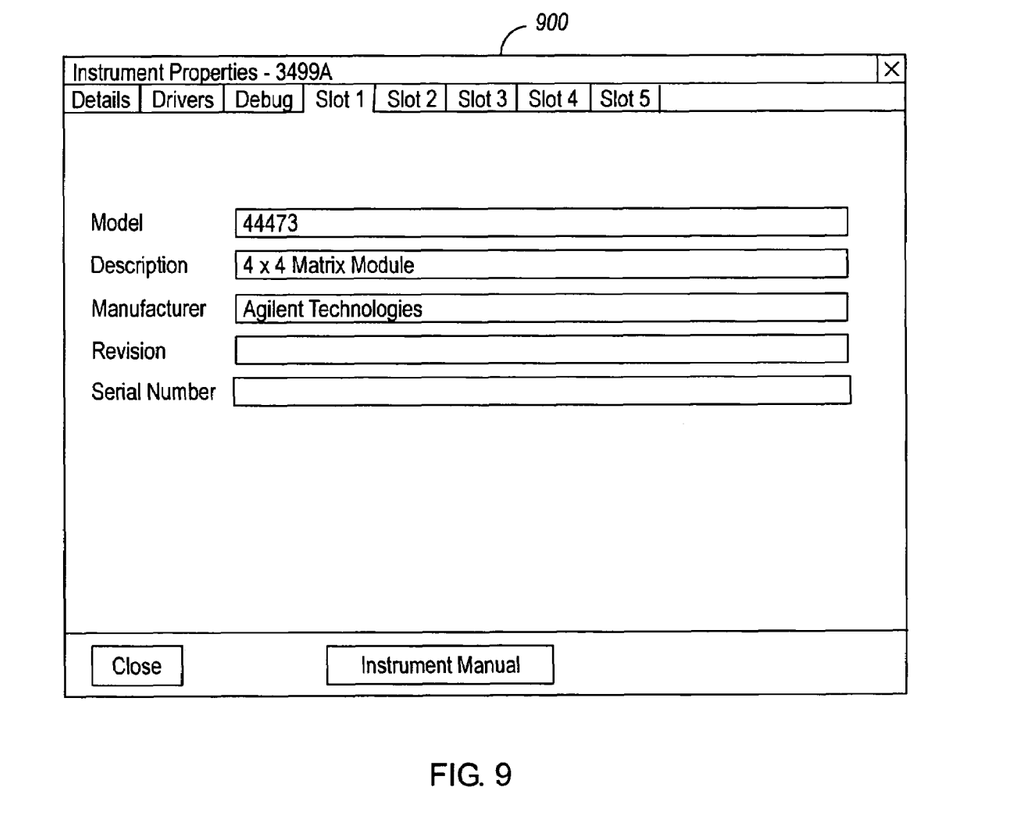

Some instruments may be variously configured with one or more expansion devices (e.g., feature cards). For example, the Agilent 3499x series or 34970A instruments each have expansion capabilities. For these instruments, the Instrument Properties interface may further provide a page 900 for each of these expansion devices. In FIG. 9, these expansion devices are referenced by the slots that they occupy (e.g., Slot 1, Slot 2, etc.). For each slot, information such as the expansion device's model number, description, manufacturer, firmware revision and serial number may be provided.

In one embodiment, each of the interface pages 600, 700, 800, 900 shown in FIGS. 6–9 may be provided with a button for closing the interface and a button for launching an instrument manual (or "Help").

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Apparatus, comprising:
   computer readable media; and
   program code, stored on said computer readable media, comprising:
      code to determine a current configuration of instruments which are connected in a user's test system;
      code to retrieve an icon associated with each instrument;
      code to display the icons within a graphical user interface (GUI), and to graphically connect the icons in accordance with said current configuration of instruments; and
      code to compare said current configuration to a past configuration and, upon detecting differences in the configurations, graphically represents said differences within the GUI, said represented differences including indications of instruments that appeared in the past but not the current configuration.

2. The apparatus of claim 1, further comprising:
   code to, in response to user input via a graphical pointer, reposition selected ones of the icons within the GUI; and
   code to reroute the graphical connections between the icons, in response to said repositioned icons.

3. The apparatus of claim 1, further comprising:
   code to maintain a database of said icons; and
   code to receive identifying data for a new instrument, and to associate an icon representing said new instrument in said database.

4. The apparatus of claim 1, wherein said program code automatically executes on a periodic basis, thereby updating said icons and connections displayed in said GUI.

5. The apparatus of claim 1, wherein said differences in the current and past configurations are graphically represented by:
   a first color to highlight icons associated with instruments that appear in the current but not the past configuration;
   a second color to highlight icons associated with instruments that appear in the past but not the current configuration; and
   a third color to highlight icons associated with instruments that are believed to appear in the past and current configurations, but which have one or more properties that do not match.

6. The apparatus of claim 1, wherein said differences in the current and past configurations are graphically represented by:
   a first box style to identify said icons associated with instruments that appear in the current but not the past configuration;
   a second box style to identify said icons associated with instruments that appear in the past but not the current configuration;
   a third box style to identify said icons associated with instruments that are believed to appear in the past and current configurations, but which have one or more properties that do not match.

7. The apparatus of claim 1, further comprising:
   code to, upon selection of an instrument icon, coupled with a given menu selection, launch an instrument properties interface.

8. The apparatus of claim 7, wherein the instrument properties interface comprises a command interface.

9. The apparatus of claim 7, wherein the instrument properties interface provides information for expansion devices associated with the instrument.

10. The apparatus of claim 1, further comprising:
    code to display an icon representing a computer on which the GUI is displayed, and to graphically connect the computer to said current configuration of instruments.

11. The apparatus of claim 1, further comprising:
    code to provide drawing tools that may be used within said GUI.

12. The apparatus of claim 1, further comprising:
    code to determine a dynamic configuration of a switch to which one or more of said instruments are connected, and to dynamically display and connect said switch within said GUI.

13. The apparatus of claim 1, wherein said icons are graphical renderings of said instruments.

14. Apparatus, comprising:
    computer readable media; and
    program code, stored on said computer readable media, comprising:
       code to determine a current configuration of instruments which are connected in a user's test system;
       code to retrieve an icon associated with each instrument;
       code to display the icons within a graphical user interface (GUI), and to graphically connect the icons in accordance with said current configuration of instruments; and
       code to, upon selection of an instrument icon, coupled with a given menu selection, launch an instrument properties interface, wherein the instrument properties interface comprises a driver listing page.

\* \* \* \* \*